US006377068B1

(12) United States Patent
Golden et al.

(10) Patent No.: US 6,377,068 B1
(45) Date of Patent: Apr. 23, 2002

(54) LOW IMPEDANCE STEREO AUDIO BUS

(75) Inventors: Jeffrey Neil Golden, Beverly Hills; Akram Mufid Mufid, Ann Arbor, both of MI (US); Colin David Wright, Chelmsford (GB); Michael W. Flood, Flat Rock, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/620,672

(22) Filed: Jul. 20, 2000

(51) Int. Cl.[7] .......................................... H03K 17/16
(52) U.S. Cl. .......................................... 326/26; 326/82
(58) Field of Search .......................... 326/26, 30, 82, 326/86, 83, 89, 124, 126

(56) References Cited

U.S. PATENT DOCUMENTS 4,803,727 A * 2/1989 Holt et al. .................... 381/1
4,821,260 A * 4/1989 Klank et al. .................. 370/77
5,880,601 A * 3/1999 Kanazawa et al. ............ 326/68
5,920,204 A * 7/1999 Bruno ......................... 326/86
6,124,727 A * 9/2000 Bridgewater, Jr. et al. .... 326/86

* cited by examiner

*Primary Examiner*—Don Phu Le
(74) *Attorney, Agent, or Firm*—Larry I. Shelton

(57) ABSTRACT

A low impedance stereo audio bus interface between multiple audio transmitters and a receiver. The bus has a core transmitter circuit associated with each output of the multiple audio transmitters and each core transmitter circuit generates a pair of balanced differentiated outputs. The pair of balanced differentiated outputs of the core transmitter circuits are connected in parallel to a core receiver circuit, which recombine the pair of balanced differentiated signals to reproduce the original stereo signals at the input to the receiver. The bus may contain optional circuits to perform functions not performed elsewhere in the transmitter or receiver.

17 Claims, 3 Drawing Sheets

LOW IMPEDANCE STEREO AUDIO BUS

TECHNICAL FIELD

The invention is related to the field of audio busses and in particular to low impedance stereo audio busses.

BACKGROUND ART

With the increase in electronic systems in the home, office and automotive environments, many of them have audio outputs. Currently, most of these devices, such as radios, CD players, mobile phones, television and similar devices have separate audio output signals activating separate speaker systems or recording devices.

Currently, there is a need for a low impedance stereo audio bus which interfaces a plurality of audio signal sources and permits access to a single stereo speaker system and/or electronic storage device which eliminates redundancy and multiple connectors.

DISCLOSURE OF INVENTION

The low impedance stereo audio (LISA) bus provides for parallel connection of a virtually unlimited number of audio sources called transmitters to one or more receivers such as a stereo speaker system. The low impedance stereo audio bus allows summing or mixing of selected transmitters, and is architected as a two-channel balanced differential, low impedance interface. The frequency response of the bus is essentially flat from 20 Hz to 20 kHz making it appropriate for all audio applications, including audiophile, and is designed to be compliant with typical automotive E.M.C. requirements.

The LISA bus has a core transmitter circuit connected to each output provided by each transmitter. For example, for a stereo transmitter, the LISA bus will have a core transmitter associated with each of the two audio outputs. Each core transmitter will generate a pair of balanced differentiated outputs for each output of the transmitter. The LISA bus also has at least one pair of core receivers at a location remote from the core transmitter. The balanced differentiated outputs of all of the core transmitters are connected in parallel to the inputs of the core receivers. The core receivers combine or reunite to a pair of balanced differentiated outputs to reproduce the stereo audio signals received from the core transmitters. A master control arbitrates which transmitter or transmitters have access to the receiver and at what relative output level.

If not provided elsewhere in the transmitters, each core transmitter will include a muting circuit, a full-scale adjustment amplifier controlled by a master control. For complex transmitters, a step attenuator circuit controlled by a master control will also be included. The core receiver may include a gain compensation circuit when two or more receivers are connected to the LISA bus. The gain of the LISA bus is unity with its output signal to the receiver being substantially equal to the input signal received from the transmitter.

One advantage of the LISA bus is that the transmitters and receivers are simply connected in parallel resulting in minimum wiring and interconnection complexity.

Another advantage of the LISA bus has a maximum reliability because the transmitters are connected in parallel and there is no need to route signals in series through other components. Hence, failure of one connected component does not render the bus inoperable.

Still another advantage is that two or more transmitters may access the LISA bus simultaneously.

Another advantage is that multiple receivers may be connected to the LISA bus by providing gain compensation in the associated core receivers and output level control may be provided in the core transmitter.

Still another advantage is that the master control controls which transmitter or transmitters will have access to the LISA bus and at what output level.

Another advantage of the LISA bus is that the master control monitors how many transmitters and receivers are connected to the LISA bus.

These and other advantages will become more apparent from reading the detailed description in conjunction with the drawings.

BEST MODE FOR CARRYING OUT THE INVENTION

Figure 1:
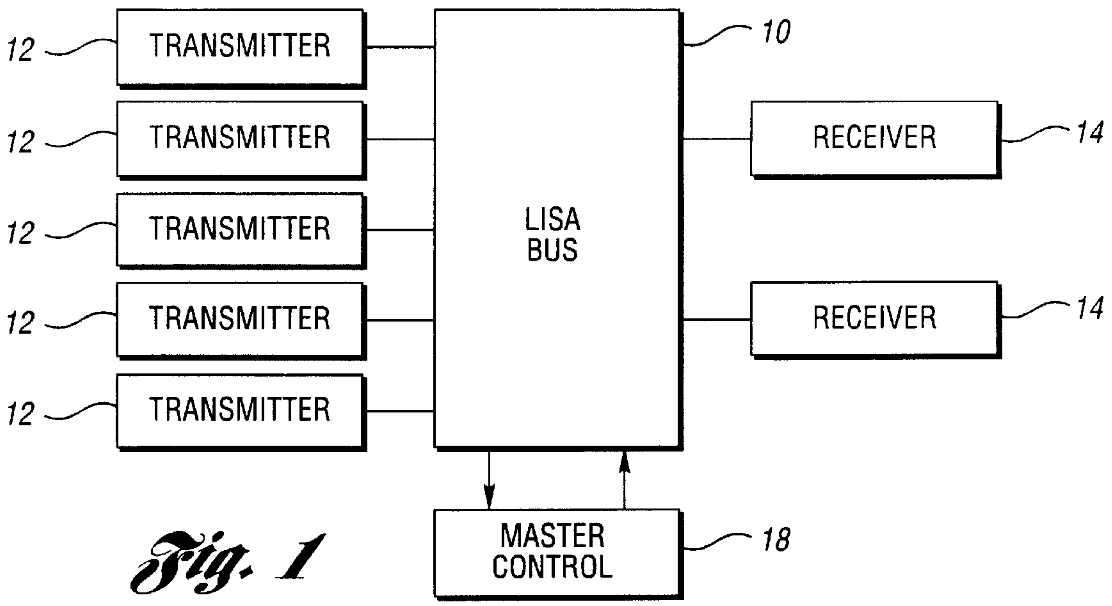
FIG. 1 is a block diagram showing the relationship of the LISA bus relative to the transmitters and receivers.
Figure 2:
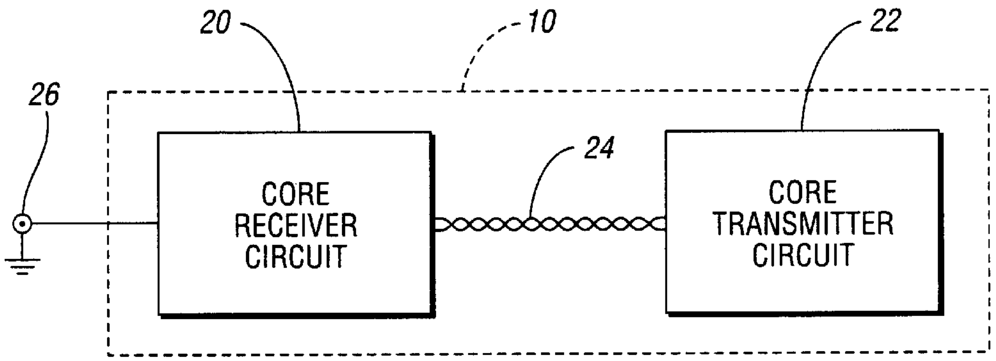
FIG. 2 is a block diagram of the LISA bus core components.

FIG. 1 is a block diagram showing the Low Impedance Stereo Audio Bus 10 in an automotive environment. Although the low impedance stereo audio bus 10, hereinafter referred to as a LISA bus, is shown in an automotive environment, its use outside the automotive field will become apparent and therefore is not limited to the automotive field.

Referring to FIG. 1, the LISA bus 10 connects a plurality of audio transmitters 12 to at least one receiver 14. The receivers 14 may be one or more loudspeakers located at various locations within the vehicle as is known in the art or may be one or more recording or storage types of devices. The transmitters 12 may be a radio, a cassette player, a compact disc (CD) player, the audio portion of a televison set, a mobile telephone, warning announcements or an electronic game. The operation of the LISA bus 10 is controlled by a master control 18. The master control 18 determines which transmitter will have access to the receivers on a priority basis. The master control 18 may allow the audio signals from two or more transmitters to be mixed, or provide on the basis of priority, the muting of all lower priority transmitters when a higher priority transmitter has requested access to the receiver. For example, a "low oil pressure" warning announcement, generated by the vehicle's engine control system, would have priority over the signals generated by a radio or CD player. If such a "warning announcement" device requests authority to transmit via the LISA bus 10, the outputs of the radio or CD player would be muted so that the "warning announcement" would not be lost in the din of the other audio outputs.

The LISA bus 10 has two fundamental or basic circuits, the core transmitter circuit 20 and the core receiver circuit 22. The core transmitter circuit 20 is preferably incorporated within each transmitter and generates a balanced differentiated pair of outputs which may be connected to the appropriate core receiver circuits 22 by a pair of twisted wires 24 such that any noise introduced into one of the wires is also introduced into the other and will cancel each other in the core receiver circuit 22.

Figure 3:
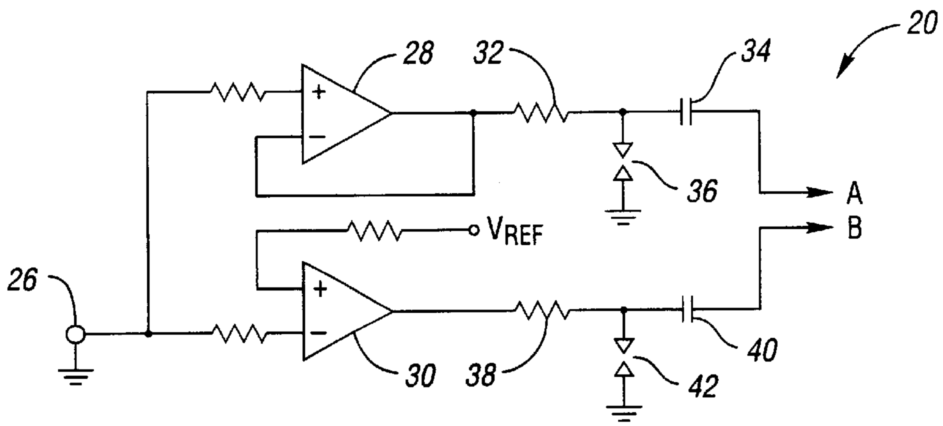
FIG. 3 is a circuit diagram of the core transmitter circuit.

The details of a core transmitter circuit 20 associated with one output of a transmitter 12 are shown on FIG. 3. It is recognized that each transmitter may have more than one audio output. For example, a stereo radio would have at least two audio outputs and a CD player may have more than two outputs. Only one core transmitter circuit 20 will be discussed to avoid redundancy since the other core transmitter circuits are basically the same.

Referring to FIG. 3, the output of the transmitter 12 is received at an input terminal 26. The input terminal 26 is connected through separate resistors to the positive input to a first amplifier 28 and negative input to a second amplifier 30. The output of the first amplifier 28 is connected back to its negative input. In a like manner the output of the second amplifier is connected to its negative input. The positive input to amplifier 30 is connected to a reference voltage. The outputs A and B of the amplifiers 28 and 30 are a pair of balanced differentiated outputs. The amplifiers 28 is protected from electrostatic discharge by resistance 32 capacitance 34 and spark gap device 36. In a like manner the amplifier 30 is protected from electrostatic discharge by resistance 38, capacitance 40 and spark gap device 42. The core transmitter circuit 20 is replicated for each output of each transmitter 12.

Figure 4:
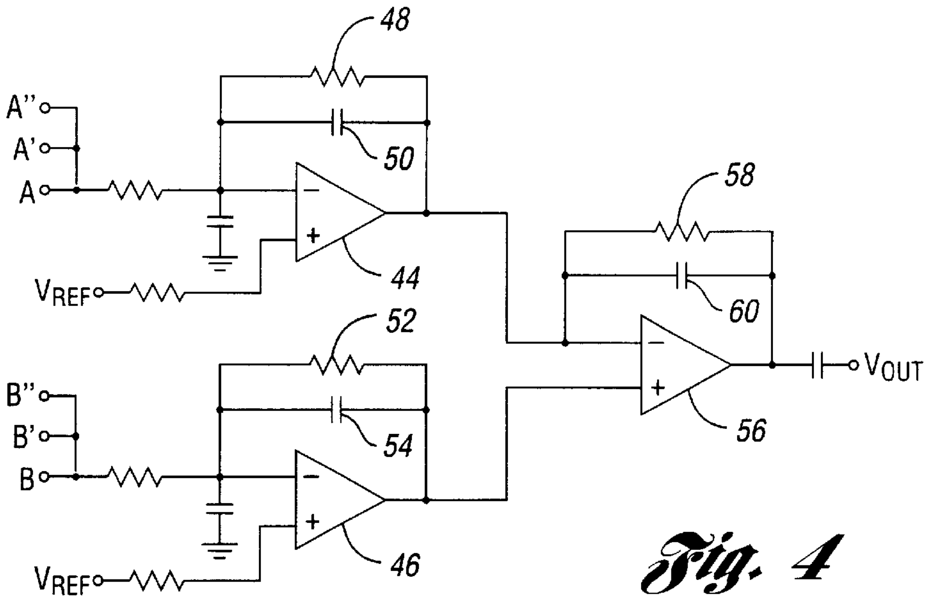
FIG. 4 is a circuit diagram of the core receiver circuit.

The details of the core receiver circuit 22 are shown on FIG. 4. The outputs A and B of each core transmitter circuit 20 are connected to the negative inputs to amplifiers 44 and 46 respectively. The inputs to the amplifiers 44 and 46 designated A, A' and A" and B, B' and B" respectively represent the inputs received from three different transmitter circuits connected in parallel.

The output of amplifier 44 is connected back to its negative input by resistance 48 and capacitance 50 while the output of amplifier 46 is connected back to its negative input by resistance 52 and capacitance 54. The positive inputs to amplifiers 44 and 46 are connected to a reference voltage $V_{REF}$. The outputs of amplifier 44 and 46 are further connected respectively to the positive and negative inputs of amplifier 56. Amplifier 56 reunites the balanced differentiated signals A and B received from the selected core transmitter circuit 20 into a single output. Resistance 58 and capacitance 60 are connected between the output of amplifier 56 and its negative input to provide the desired gain. The output of amplifier 56 is the output signal of the core receiver circuit 22 which is applied to the receiver 14. The output from amplifier 56 in the core receiver circuit is at unity with the signal applied to the input of the core transmitter circuit 20. The overall nominal gain of the LISA bus 10 is equal to 0 dB.

Figure 5:
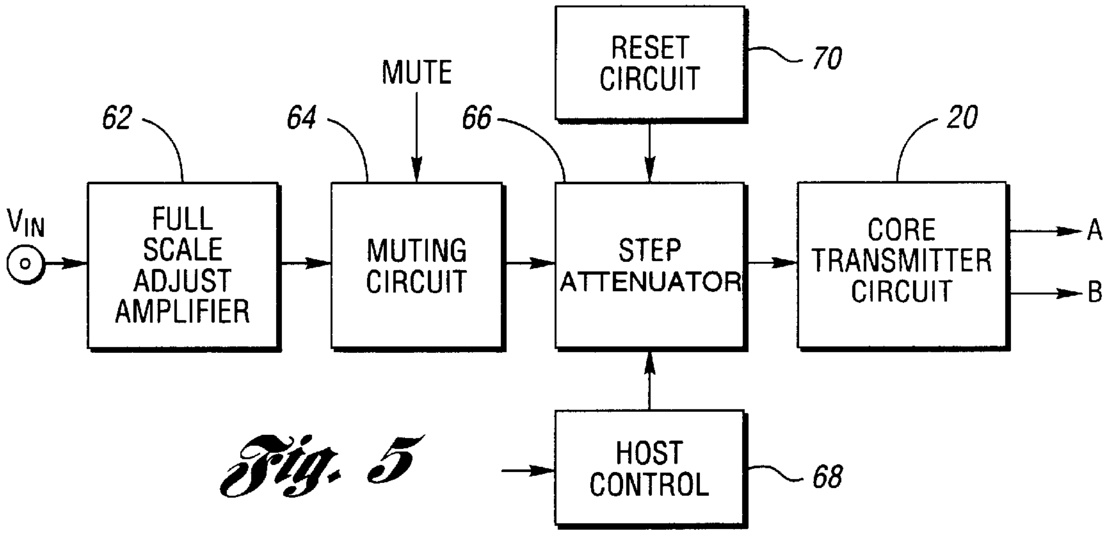
FIG. 5 is a block diagram showing the optional circuits associated with the core transmitter circuit.

The portion of the LISA bus 10 associated with each output of each transmitter 12 may further include optional circuits as shown on FIG. 5. A Full Scale Adjust Amplifier 62 may be included upstream of the core transmitter circuit to match the particular signal output by the associated core receiver circuit 14 correctly at the input to the core transmitter circuit. The Full Scale Adjust Amplifier 62 may be omitted if the matching function is performed elsewhere in an earlier signal processing stage within the transmitter. The LISA bus does not require nor is it intended that all transmitters be capable of driving the core transmitter circuit 20 at full scale.

The LISA bus 10 may also include a Muting Circuit 64 upstream of the core transmitter circuit if this function is not prepared elsewhere in an earlier processing stage of the transmitter. This circuit uses two analog switches for each channel. The analog switches simply shorts the input to the core transmitter circuit 20 to a reference voltage ($V_{REF}$) to silence the output of the associated transmitter. The drive signal is also switched open in the muted state to assure maximum muting of the audio signal. Open circuiting inactive transmitters is not required nor allowed with the LISA bus. Muting inactive transmitters must be achieved by silencing their outputs.

A Step Attenuator Circuit 66 is an optional circuit associated with the LISA bus if output level control is not supported nor implemented in an earlier signal processing stage of the transmitter. The Step Attenuator Circuit 66 is connected upstream of the core transmitter circuit and provides a 2 dB step attenuation implemented through the switching of an appropriate resistor value in the feedback loop of an associated amplifier. A transmitter Host Control circuit 68 provides for a single memory mapped control of the Step Attenuator Circuit 66.

The number of allowed simultaneous active transmitters summing their respective signals on the LISA bus is specified. The trade-off associated with multiple transmitters transmitting simultaneously results in a reduction of signal to noise ratio as seen at the receiver 14. Because non-coherent signal sources combine as the "square root of the sum of the squares", the full scale signal level generated by each core transmitter circuit must be reduced from that which would be available if there was only one active transmitter allowed on the bus. If the maximum available voltage swing of the transmitter/receiver circuits 20 and 22 respectively is equated to a single transmitter full scale output to maximize the signal-to-noise ratio, other transmitters coming on line can cause clipping which is unacceptable. This, in turn, results in an equivalent reduction in the full scale output voltage swing at the receiver, reducing the signal-to-noise ratio.

A Reset Circuit 20 may also be included to provide a power up "one shot" reset and may include a manual reset button. This Reset Circuit 20 is not required if the Step Attenuator Circuit 66 and the Host Control 68 are not used.

The optional circuits to the LISA bus 10 shown on FIG. 5 may be included when required or desired. These optional circuits may be connected in series as shown, but their order may be changed and one or more may be omitted.

Multiple receivers may be connected to the LISA bus only if gain compensation is provided in each receiver circuit such as provided for by the Gain Compensation Circuit 72. This is due to the fact that the output signal level of the receiver is connected to the bus is related to the number of connected receivers (n) by the equation:

$$\text{Attenuation per receiver} = -20 \log (n)^{-1};\ n = 1, 2, 3 \ldots$$

Hence, system intelligence and variable gain control is required in the receiver circuit 22 to permit multiple receivers.

Figure 6:
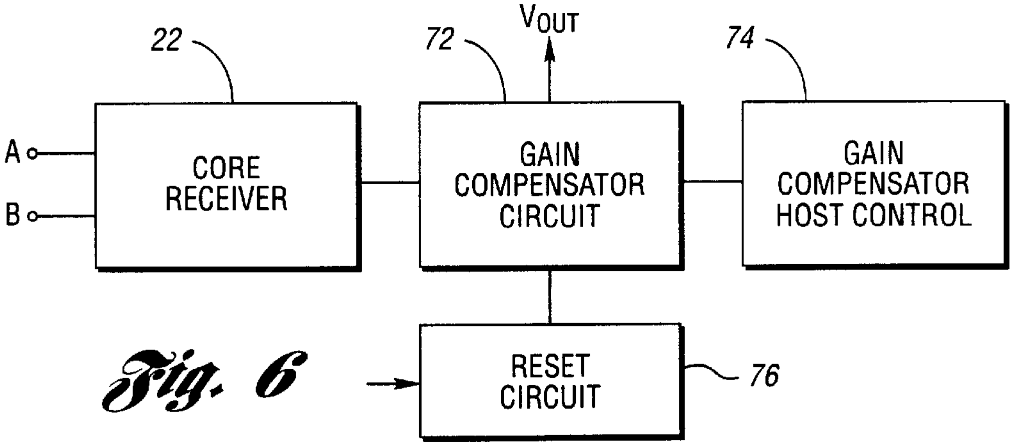
FIG. 6 is a block diagram showing the optional circuits associated with the core receiver circuit.

Referring now to FIG. 6, a Gain Compensation circuit 72 and a Receiver Host Control 74 may be included downstream of the core receiver circuit 22. The Gain Compensation Circuit 72 maintains the nominal overall gain of the LISA bus 10 at unity when more than one core receiver circuit is connected to the LISA bus. This Gain Compensation Circuit 72 may be omitted if gain compensation is performed in a subsequent signal processing stage of the receiver 22. The Gain Compensation Host control 74 provides for a simple memory mapped control of the Gain Compensation Circuit 72 activated by the Master Control 18.

The receiver circuit may also include a Reset Circuit 76 that provides a power up "one shot" reset. A manual button reset of approximately 165 m sec in duration performs the reset function. The Reset Circuit 76 is not required if the Receiver Gain Compensation Circuit 72 and Receiver Host Control 74 is not used.

The LISA bus takes advantage of the virtual ground/summing properties of readily available integrated circuit operational amplifiers. Fundamentally, the LISA bus provides for the parallel connection of a number of transmitters (audio sources) to one or more receivers. The LISA bus allows summing (mixing) of multiple transmitters if desired, and is architected as a two channel balanced differentiated low impedance interface. It is to be noted, that although the particular embodiment described is directed to a two channel stereo bus, it is obvious the architecture is scalable to any number of channels. The frequency response of the LISA bus is essentially flat from 20 Hz to 20 kHz making it appropriate for all audio applications and is designed to be compliant with current automotive E.M.C. requirements.

The advantages of the LISA bus over prior art audio interfaces include:

Minimum wiring/interconnection complexity, transmitter and receiver components simply connect in parallel.

Maximum reliability, because transmitters are connected in parallel, there is no need to rout audio signals in series through other components (e.g. daisy chaining) hence, failure of one connected transmitter or receiver does not render the LISA bus inoperable.

Two or more transmitters may direct their audio signals on the LISA bus simultaneously.

This capability, which is desirable under certain conditions, is not available with prior art interfaces.

Multiple receivers may be connected by providing gain compensation in each receiver circuit. System intelligence via the Master Control 18 and variable gain capability upstream of the core receiver circuit is optionally provided for. Simultaneously, output level control is also optionally provided for downstream of the core transmitter circuit.

Figure 7:
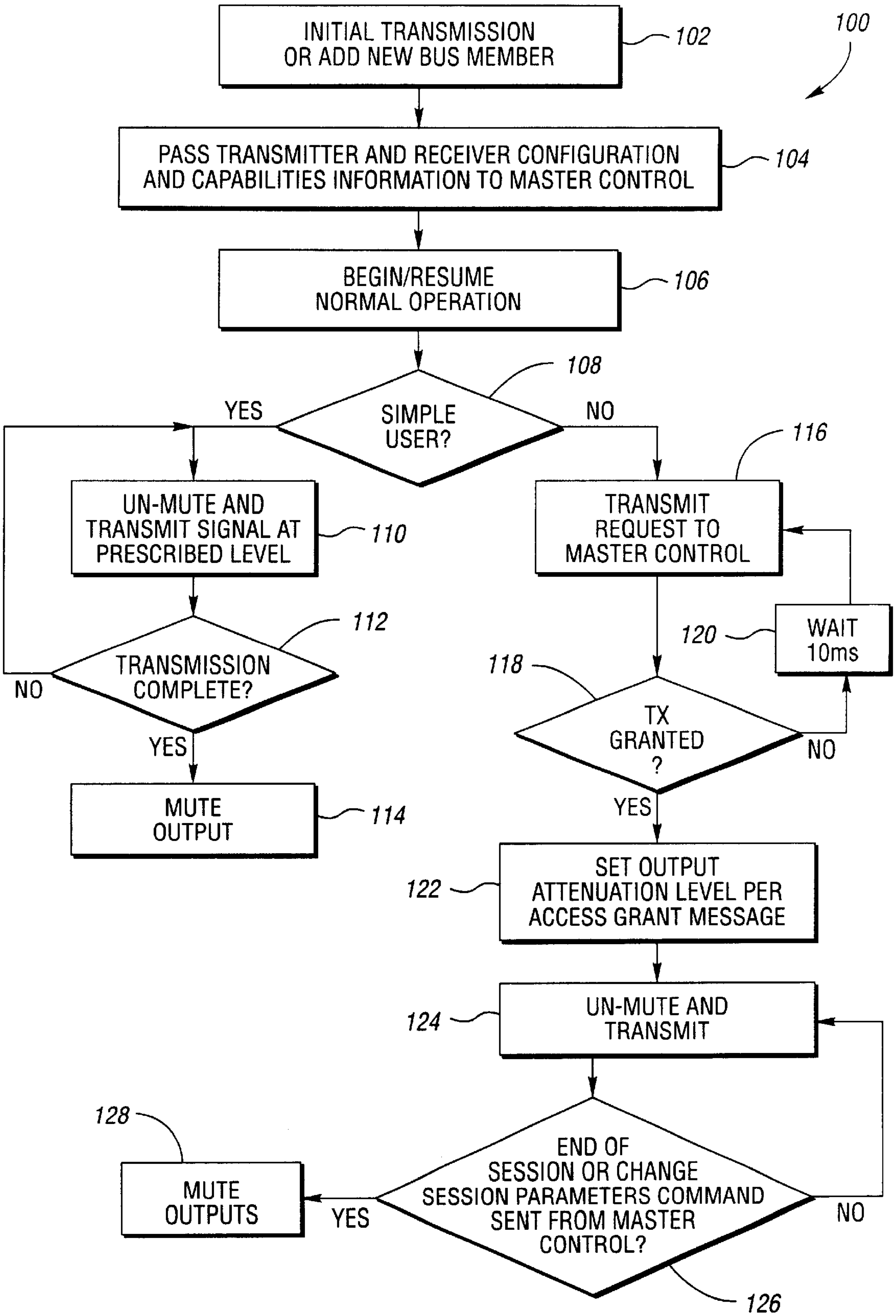
FIG. 7 is a flow diagram illustrating the operations performed by the master control.

The operation 100 of the Master Control 18 is illustrated by the flow diagram shown on FIG. 7. This flow diagram is discussed relative to an audio signal being transmitted by one of the transmitters 12 or in the alternative, a new member, transmitter 12 and/or receiver 14 being added to the LISA bus. Upon initiation indicated by block 102, a transmit request or audio available message is generated by the transmitter having an audio output available for transmission. The transmit request message contains the transmitter and receiver identifications, along with configuration and capabilities information. This information is passed to the Master Control 18, block 104. After the required information is passed to the Master Control, the Master Control begins or resumes normal operation. The Master Controller will first inquire if the request message is that of a simple user, decision block 106. A simple user does not require changing the attenuation levels or configuration of the LISA bus. If the requesting transmitter is a simple user, the Master Control will un-mute the transmitter output and permit the transmitter to transmit its audio signal at the prescribed level, block 110. The Master Control monitors the transmission to determine when the transmitter has completed its transmission, "e.g. turned off", decision block 112. If the transmitter has not ceased to transmit, the Master Control will return to block 110 and the LISA bus will maintain the transmitter in an un-muted state. If the transmission is terminated, the LISA bus will mute the output of the transmitter effectively disconnecting the transmitter from the receiver.

Returning to decision block 108, if the request is from a complex user, the transmit request is transmitted to the Master Control block 116. This request will include the priority and identification of the requesting transmitter. The Master Control will then determine if the transmitter requesting to transmit can have access to the bus. If it has the highest priority, the request will be granted. If the request is not granted, decision block 118, the Master Control will wait 10 m sec, block 120 and again check to see if the request has been granted. This loop will be repeated until the request is granted or the request is terminated.

In response to the request being granted, the Master Control will set the output attenuation, by means of the Step Attenuator Circuit 66 and Host Control 68, per the grant message, block 122. The Master Control will then un-mute the transmitter permitting its transmission to proceed. The Master Control will then monitor the transmission, decision block 126 and mute the transmitter output, block 128, when the transmission is terminated or change the transmission parameters command sent from the Control Master.

While the best mode for carrying out the invention has been described in detail, those familiar with the art to which this invention relates will recognize various alternative designs and embodiments for practicing the invention as defined by the following claims.

What is claimed is:

1. A low impedance audio bus for connecting the outputs of at least two audio transmitters to a receiver, the bus comprising:

a plurality of core transmitter circuits, one of the plurality of core transmitter circuits associated with a respective one of the at least two transmitters, each core transmitter circuit responsive to the electrical audio output signal of the associated core transmitter circuit to generate a pair of balanced differentiated audio output signals;

at least one core receiver circuit operative to recombine the pair of balanced differentiated audio output signals to generate an electric audio output signal applied to the receiver;

means for transmitting the pair of balanced differentiated audio output signals from each core transmitter circuit, in parallel, to the input to the at least one core receiver circuit; and a master control operative to control which of the at least two transmitters has access to the low impedance audio bus to transfer the output of the associated core transmitter circuit to the core receiver circuit.

2. The low impedance audio bus of claim 1, wherein at least one of the at least two transmitters generates a pair of audio stereo output signals and the core receiver circuit is responsive to a pair of audio stereo signals, the plurality of core transmitter circuits further includes a core transmitter circuit associated with each audio stereo output signal of the pair of stereo output signals and the at least one core receive circuits comprises two core receiver circuits, one associated with a respective one of the core transmitter circuits associated with the pair of audio stereo output signals, the two core receiver circuits regenerating the pair of audio stereo output signals applied to the receiver.

3. The low impedance audio bus of claim 2 wherein the at least two audio transmitters are two transmitters having audio stereo output signals, the plurality of core transmitter circuits comprises at least four core transmitter circuits, one core transmitter circuit associated with a single one of audio stereo outputs of the at least two transmitters and wherein the master control controls the access of the two transmitters to the low impedance audio bus.

4. The low impedance audio bus of claim 3 further including a muting circuit activated by the master control to mute the audio stereo output signals of the transmitter not having access to the low impedance audio bus when the muting function is not provided for elsewhere in the transmitter.

5. The low impedance audio bus of claim 4 wherein the muting circuit shorts the audio electrical output signal of the transmitter not having access to the low impedance audio bus to a reference voltage.

6. The low impedance audio bus of claim 1 wherein the gain of the core transmitter and core receiver circuits is unity.

7. The low impedance audio bus of claim 1 wherein the band pass frequency of the bus is in the range from 20 $H_z$ to 20 K $H_z$.

8. The low impedance audio bus of claim 1 wherein the at least two transmitters comprises a plurality of transmitters.

9. The low impedance audio bus of claim 1 further including a full scale adjustment amplifier to adjust audio output signals generated by selected core receiver circuits to be equal to a predetermined audio input to the core transmitter circuit.

10. The low impedance audio bus of claim 2 further including a step attenuator circuit upstream of each core transmitter circuit for attenuating the audio signal input level to the core transmitter circuit under control of the master control when more than one transmitter has simultaneous access to the low impedance stereo audio bus.

11. The low impedance audio bus of claim 2 further including a gain compensation circuit downstream of each core receiver circuit, the gain compensation circuit, under control of the master control, maintains the nominal overall gain of the low impedance stereo audio bus at unity when more than one receiver is connected to the bus.

12. A low impedance stereo audio bus interfacing at least one stereo transmitter generating a pair of transmitter output signals and at least one receiver, the bus comprising:

a core transmitter circuit receiving a respective one of the pair of transmitter output signals, each core transmitter circuit generating a pair of balanced differentiated signals in response to the received respective one of the pair of transmitter output signals; and a pair of core receiver circuits associated with the at least one receiver, each core receiver circuit connected to a respective one of the core transmitters and operative to reunite the pair of balanced differentiated signals to generate an output signal applied to the receiver corresponding to the signal received by the associated core transmitter circuit.

13. The bus of claim 12 wherein the at least one transmitter comprises at least two transmitters, each transmitter producing a pair of transmitter output signals, the corresponding ones of the pair of balanced differentiated signals generated by the core transmitter circuits are received in parallel by the pair of core receivers, the bus further including a master control controlling which transmitter has access to the bus.

14. The bus of claim 13 wherein each transmitter has an assigned priority for access to the bus, the master control grants access to the bus by the transmitter having the highest priority when access is requested and activates the muting circuits associated with all of the other transmitters to mute the outputs of all of the other transmitters.

15. The bus of claim 12 further including a full scale adjustment circuit upstream of the core transmitter circuit to adjust the signal output from the core receiver circuit to a predetermined maximum value.

16. The bus of claim 12 further including a step attenuator circuit upstream of the transmitter circuit for attenuating the signal input to the core receiver circuit when more than two transmitters are allowed simultaneous access to the bus, the step attenuator being controlled in response to signals generated by the master control in response to an access request.

17. The bus of claim 12 further including a gain compensation circuit downstream of the core receiver circuit to maintain the nominal overall gain of the bus at unity when more than on e receiver is connected to the bus, the gain compensation being controlled in response to signals generated by the master control.

* * * * *